(12) United States Patent
Miyawaki

(10) Patent No.: US 7,059,859 B2
(45) Date of Patent: Jun. 13, 2006

(54) MANUFACTURING METHOD OF SEMICONDUCTOR DEVICE

(75) Inventor: Yoshihiko Miyawaki, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/038,502

(22) Filed: Jan. 21, 2005

(65) Prior Publication Data

US 2005/0181589 A1     Aug. 18, 2005

(30) Foreign Application Priority Data

Jan. 21, 2004    (JP)    ............................. 2004-013427

(51) Int. Cl.
     H01L 21/00    (2006.01)
(52) U.S. Cl. .................. 433/238; 438/382; 438/383
(58) Field of Classification Search ............. 438/238, 438/382–385
     See application file for complete search history.

(56) References Cited

U.S. PATENT DOCUMENTS 5,232,865 A * 8/1993 Manning et al. ............ 438/382

FOREIGN PATENT DOCUMENTS

JP    07-195093    12/2000

* cited by examiner

*Primary Examiner*—H. Jey Tsai
(74) *Attorney, Agent, or Firm*—Morrison & Foerster LLP

(57) ABSTRACT

In a semiconductor device having a MOS transistor and a diffused resistor layer, a leakage current of a diffused resistor layer is suppressed. A film of gate electrode material is formed over the entire surface of an N-type well, a photoresist layer is formed to mask a region to form a gate electrode and portions of the diffused resistor layer and the gate electrode and a damage prevention films are formed by anisotropically etching the film of gate electrode material. After forming a CVD insulation film over the entire surface of the N-type well, sidewall spacers are formed on sidewalls of the gate electrode and the damage prevention films by anisotropically etching the CVD insulation film. A source layer and a drain layer of the MOS transistor and contact regions to the diff-used resistor layer are formed by doping portions of the N-type well and the diffused resistor layer with high concentration P-type impurities using the gate electrode, the damage prevention film and the sidewall spacers as a mask.

7 Claims, 6 Drawing Sheets

MANUFACTURING METHOD OF SEMICONDUCTOR DEVICE

CROSS-REFERENCE OF THE INVENTION

This invention is based on Japanese Patent Application No. 2004-13427, the content of which is incorporated herein by reference in its entirety.

BACKGROUND OF THE INVENTION

1. Field of the Invention

This invention relates to a manufacturing method of a semiconductor device, specifically to a manufacturing method of a semiconductor device having a MOS transistor and a diffused resistor formed on the same semiconductor substrate.

2. Description of the Related Art

A Bi-MOS IC has been known as a semiconductor device used in a circuit for a receiver such as a television. The Bi-MOS IC is a semiconductor device in which, for example, a MOS transistor and a diffused resistor layer are formed on a single semiconductor substrate together with a bipolar transistor capable of driving a large current. The MOS transistor usually has a sidewall spacer on a sidewall of its gate electrode. The diffused resistor layer is formed by doping the semiconductor substrate with low concentration impurities and used for a purpose such as voltage reduction required in the circuit.

Next, a manufacturing method of a semiconductor device according to the prior art applicable to the Bi-MOS IC will be explained, referring to FIGS. 8-12, which are cross-sectional views showing the manufacturing method of the semiconductor device according the prior art. Although various electronic devices including a bipolar transistor are formed on a P-type semiconductor substrate 10, FIGS. 8–12 show only a region in which a MOS transistor 20 and a diffused resistor layer 30 are formed.

At first, an N-type well 11 is formed on the P-type semiconductor substrate 10, as shown in FIG. 8. Device isolation layers 12 are formed by LOCOS (Local Oxidation of Silicon) on the N-type well 11 around a periphery of a region in which the diffused resistor layer 30 is to be formed. Then a gate insulation film 21 made of silicon oxide, for example, is formed on the entire surface of the N-type well 11, except for the device isolation layers 12.

Next, a gate electrode 22 is formed on the gate insulation film 21 on a portion of a region separated with the device isolation layer 12 from the region in which the diffused resistor layer 30 is to be formed, as shown in FIG. 9. Then, a photoresist layer 40 is formed to have an opening 40$m$ above the region in which the diffused resistor layer 30 is to be formed by exposure using a photomask (not shown) and development. Using the photoresist layer 40 as a mask, the region of the N-type well 11 is doped with low concentration P-type impurities such as boron to form a P$^-$-type diffusion layer. The P$^-$-type diffusion layer makes the diffused resistor layer 30.

After removing the photoresist layer 40, a CVD (Chemical Vapor Deposition) insulation film 23 made of a silicon oxide film, for example, is formed by CVD over the entire surface of the N-type well 11, as shown in FIG. 10.

The CVD insulation film 23 is anisotropically etched to form a sidewall spacer 23$s$ on each sidewall of the gate electrode 22, as shown in FIG. 11.

Then, the N-type well 11 and the P$^-$-type diffusion layer are selectively doped with high concentration P-type impurities using a photomask (not shown) to form a source layer 24$s$ and a drain layer 24$d$ of the MOS transistor 20 and P$^+$-type layers 31 which serve as contact regions to the diffused resistor layer 30. The MOS transistor 20 having a sidewall spacer 23$s$ on each sidewall of its gate electrode 22 and the diffused resistor layer 30 are formed on the same P-type semiconductor substrate 10 through the manufacturing method described above. Related descriptions on the technologies mentioned above are provided, for example, in Japanese Patent No. 3143366.

With the manufacturing method of the semiconductor device according to the prior art, however, a surface of the diffused resistor layer 30 suffers damage such as crystal defect by over-etching in a process step of the anisotropic etching of the CVD insulation film 23 to form the sidewall spacers 23$s$. As a result, a variation in a status of the diffused resistor layer 30 is increased and operational characteristics of the diffused resistor layer 30 are deteriorated.

That is, when the over-etching mentioned above causes the damage to the diffused resistor layer 30, especially to a region in the diffused resistor layer close to the border with the device isolation layer 12, there arise a lot of leakage paths through which leakage current flows into the N-type well 11 (Refer to an arrow in FIG. 12.). In particular, when a bipolar transistor (not shown) formed on the P-type semiconductor substrate 10 operates long period of time, Joule heat caused by the operation heats up the diffused resistor layer 30 formed on the same P-type semiconductor substrate 10, further increasing the leakage current. It results in the deterioration of operational characteristics of the semiconductor device. Although the over-etching causes the damage to the entire surface, the region into which high concentration impurities are injected in a subsequent process step shows almost no increase in the leakage current because of the higher impurity concentration in the region compared with the other region into which low concentration impurities are injected.

SUMMARY OF THE INVENTION

This invention is directed to the improvement of the manufacturing method of a semiconductor device having a MOS transistor and a diffused resistor layer formed on the same semiconductor substrate so as to suppress the leakage current in the diffused resistor layer as much as possible.

The manufacturing method according to this invention includes forming a plurality of device isolation layers on a semiconductor substrate, doping a region in the semiconductor substrate surrounded by the device isolation layers with low concentration impurities to form a diffused resistor layer, forming a gate insulation film on the semiconductor substrate, forming a film of gate electrode material over an entire surface of the semiconductor substrate, forming a prevention film against etching on the film of gate electrode material above a region where a gate electrode is to be formed and above a portion of the diffused resistor layer, anisotropically etching the film of gate electrode material using the prevention film as a mask to form the gate electrode and a damage prevention film, forming a CVD insulation film by chemical vapor deposition over the entire surface of the semiconductor substrate, anisotropically etching the CVD insulation film to form sidewall spacers on a sidewall of the gate electrode and on a sidewall of the damage prevention film.

DETAILED DESCRIPTION OF THE INVENTION

Next, a manufacturing method of a semiconductor device according to an embodiment of this invention will be explained hereinafter, referring to figures. The semiconductor device according to the embodiment includes a MOS transistor and a diffused resistor layer, which will be described below, formed on a semiconductor substrate together with a bipolar transistor used in a circuit for a receiver such as a television and capable of driving a large current. The semiconductor device of this embodiment may also include an electronic device other than the bipolar transistor formed on the same semiconductor substrate.

FIGS. 1–7 are cross-sectional views showing the manufacturing method of the semiconductor device according the embodiment of this invention. Although various electronic devices including a bipolar transistor are formed on a P-type semiconductor substrate 10, FIGS. 1–7 show only the region in which a MOS transistor 20 and a diffused resistor layer 30 are formed. In the embodiment, the MOS transistor 20 is P-channel type and the diffused resistor layer 30 is made of a P-type diffusion layer.

Figure 1:
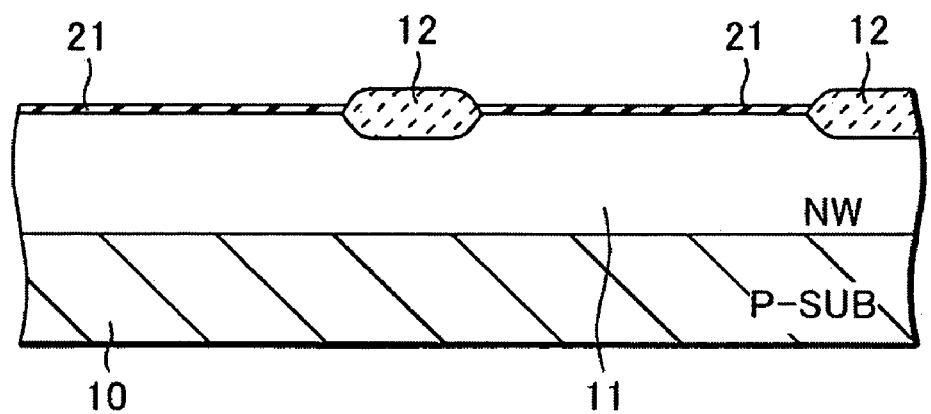
FIG. 1 is a cross-sectional view showing a manufacturing method of a semiconductor device according an embodiment of this invention.
Figure 2:
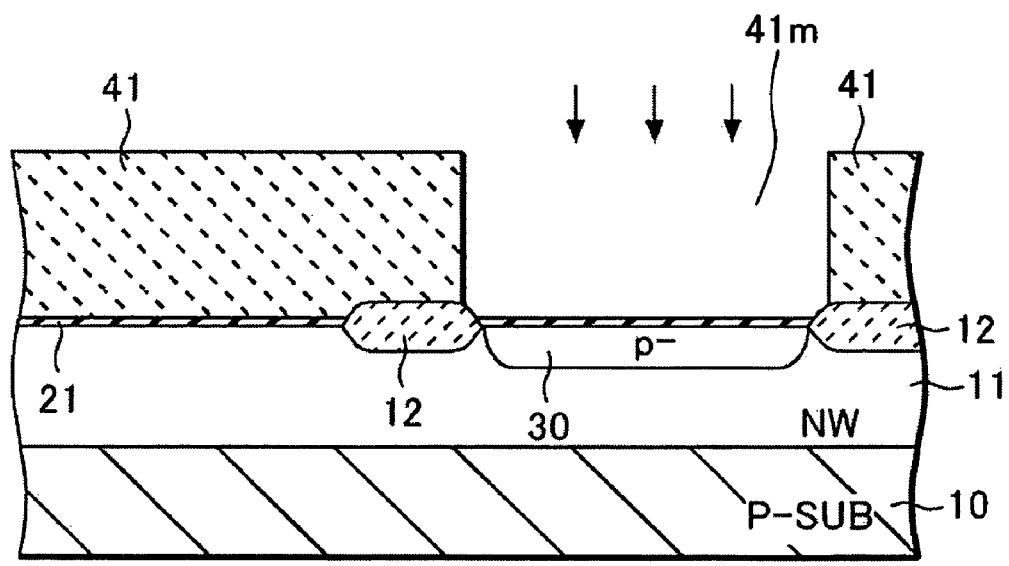
FIG. 2 is a cross-sectional view showing the manufacturing method of the semiconductor device according the embodiment of this invention.

At first, an N-type well 11 is formed on the P-type semiconductor substrate 10, as shown in FIG. 1. Device isolation layers 12 are formed by LOCOS on the N-type well 11 around a periphery of the region in which the diffused resistor layer 30 is to be formed. The device isolation layers 12 are preferably formed to be 500 nm in thickness, for example. Then a gate insulation film 21 made of silicon oxide, for example, is formed on the entire surface of the N-type well 11 except for the device isolation layers 12. The gate insulation film 21 is preferably formed to be 120 nm in thickness, for example.

Next, a first photoresist layer 41 having an opening 41m above the region in the N-type well 11 surrounded by the device isolation layers 12, i.e. the region in which the diffused resistor layer 30 is to be formed, is formed by exposure using a photomask (not shown) and development. Then, the region in the N-type well 11 surrounded by the device isolation layers 12 is doped (or ion-implanted) with low concentration P-type impurities to form a P$^-$-type diffusion layer, using the first photoresist layer 41 as a mask. The P$^-$-type diffusion layer makes the diffused resistor layer 30. Here, the low concentration P-type impurities are boron ions (B$^+$), for example. In the doping, the acceleration energy is about 30 KeV and the dose of the P-type impurities is about $6 \times 10^{12}/\text{cm}^2$ preferably.

Figure 3:
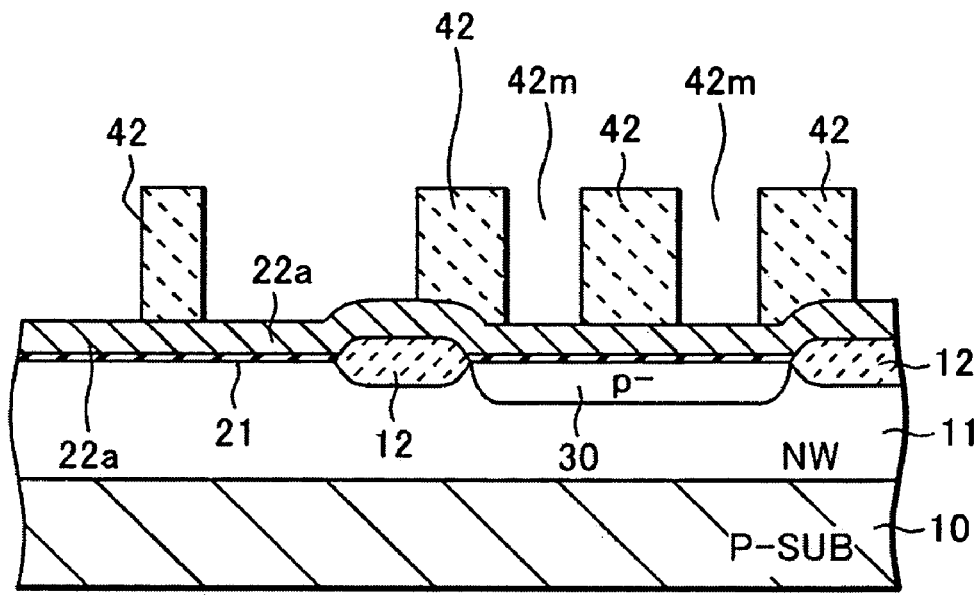
FIG. 3 is a cross-sectional view showing the manufacturing method of the semiconductor device according the embodiment of this invention.

After removing the first photoresist layer 41, a film of gate electrode material 22a to form a gate electrode 22 is formed by CVD over the entire surface of the semiconductor substrate 10 including the gate insulation film 21 and the device isolation layers 12, as shown in FIG. 3.

Then, a second photoresist layer 42 is formed on the film of gate electrode material 22a. Subsequent exposure using a mask (not shown) and development turn the second photoresist layer 42 into an etching protection layer that has openings 42m at predetermined portions and covers a region where the gate electrode is to be formed and the portions of the diffused resistor layer 30.

Figure 4:
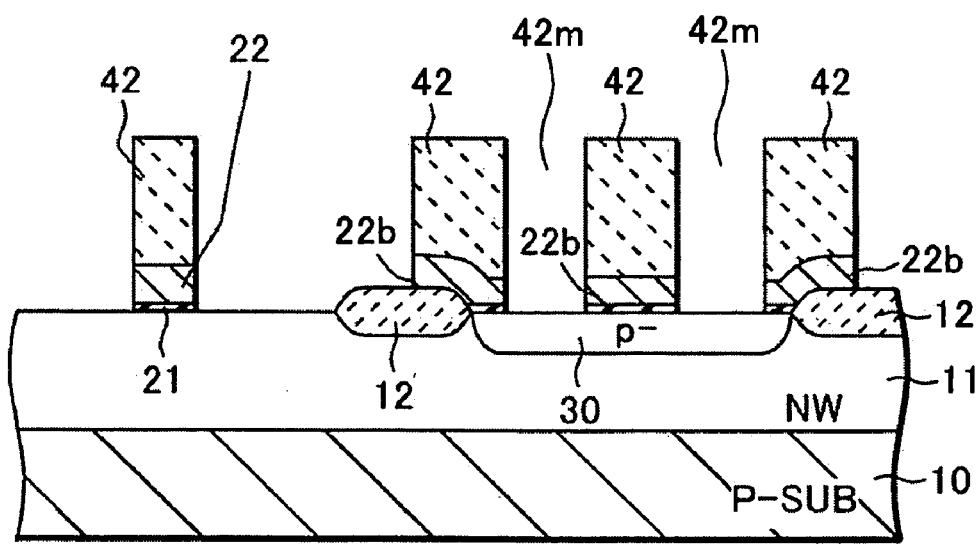
FIG. 4 is a cross-sectional view showing the manufacturing method of the semiconductor device according the embodiment of this invention.

Next, by etching the film of gate electrode material 22a using the second photoresist layer 42 as a mask, the gate electrode 22 is formed on the gate insulation film 21 on the region separated from the diffused resistor layer 30 with the device isolation layer 12 while damage prevention films 22b are formed above the portions of the diffused resistor layer 30 (portions except for regions to form contacts to the diffused resistor layer 30), as shown in FIG. 4. Here, the regions to form contacts to the diffused resistor layer 30 mean regions at both ends of the diffused resistor layer 30 where P$^+$-type layers 31 are to be formed as contact regions to the diffused resistor layer 30. Both the gate electrode 22 and the damage prevention films 22b are preferably formed to be about 200 nm in thickness. The gate electrode 22 and the damage prevention films 22b are formed of a polycide structure that is made of a polysilicon layer and a silicide layer stacked thereupon. Alternatively, they may be formed of a single layer structure made of a polysilicon layer or other structures.

Figure 5:
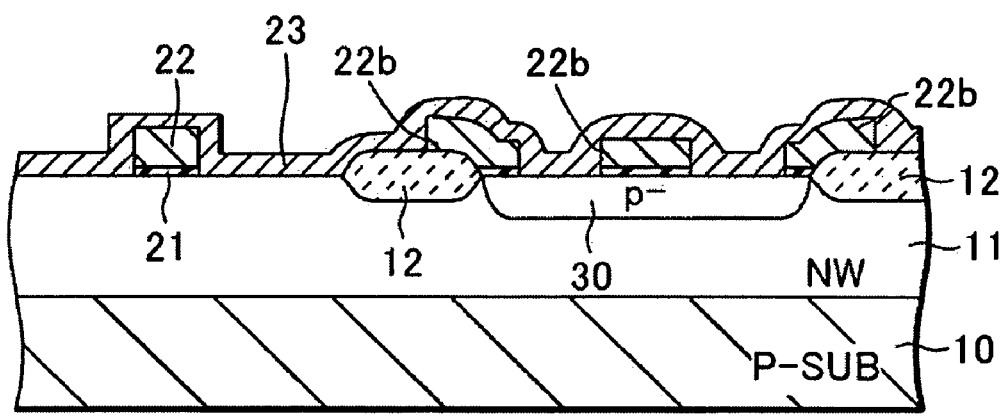
FIG. 5 is a cross-sectional view showing the manufacturing method of the semiconductor device according the embodiment of this invention.

After removing the second photoresist layer 42, a CVD insulation film 23 made of a silicon oxide film, for example, is formed by CVD over the entire surface of the N-type well 11 including the gate electrode 22, the damage prevention films 22b and the diffused resistor layer 30, as shown in FIG. 5. Apart of the CVD insulation film 23 makes a sidewall spacer 23s formed on each sidewall of the gate electrode 22. The CVD insulation film 23 is not limited to the silicon oxide film. It may be made of other material such as a silicon nitride film, for example.

Figure 6:
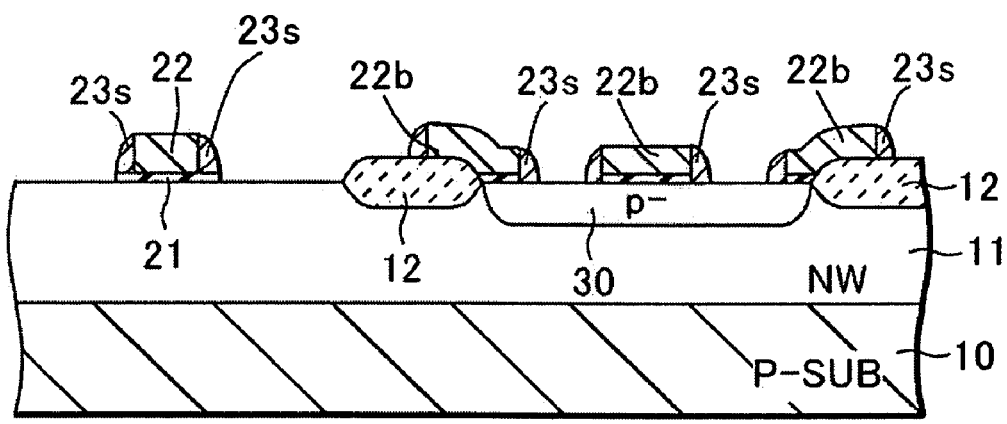
FIG. 6 is a cross-sectional view showing the manufacturing method of the semiconductor device according the embodiment of this invention.

Next, the CVD insulation film 23 is anisotropically etched, as shown in FIG. 6. The anisotropic etching is preferably plasma etching, for example. The anisotropic etching removes the CVD insulation film 23 formed on the regions to form the contacts to the diffused resistor layer 30 and on portions of the N-type well 11 as well as unnecessary CVD insulation film 23 on the gate electrode 22 and on the damage prevention films 22b. As a result, the sidewall spacer 23s is formed on each sidewall of the gate electrode 22 and the damage prevention films 22b, while the regions to form the contacts to the diffused resistor layer 30 are exposed.

The diffused resistor layer 30 except for the regions to form P+-type layers 31 remains covered with the damage prevention film 22b. Therefore, when the anisotropic etching becomes over-etching, that means etching longer than necessary, damages to the diffused resistor layer 30 caused by the over-etching can be prevented.

Figure 7:
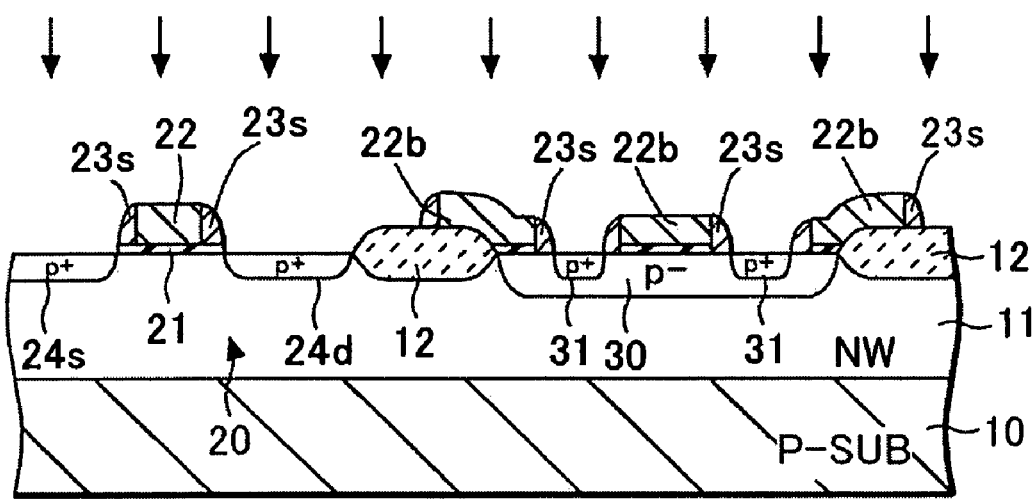
FIG. 7 is a cross-sectional view showing the manufacturing method of the semiconductor device according the embodiment of this invention.
Figure 8:
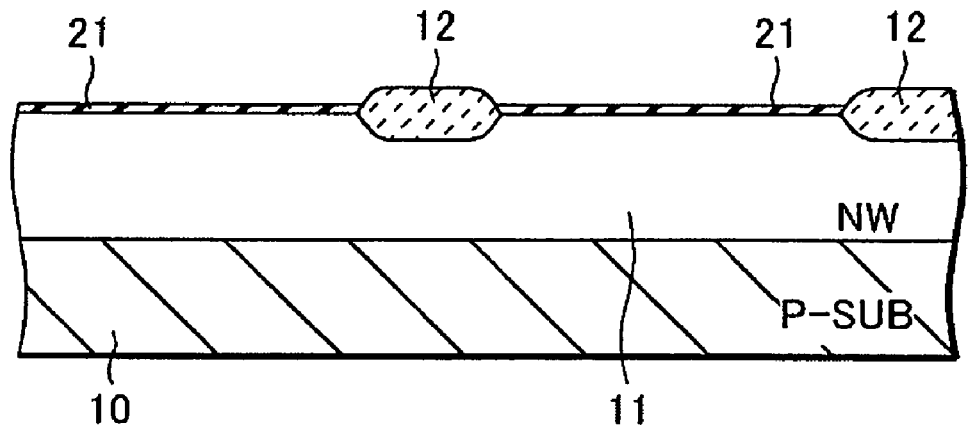
FIG. 8 is a cross-sectional view showing a manufacturing method of a semiconductor device according to a conventional art.
Figure 9:
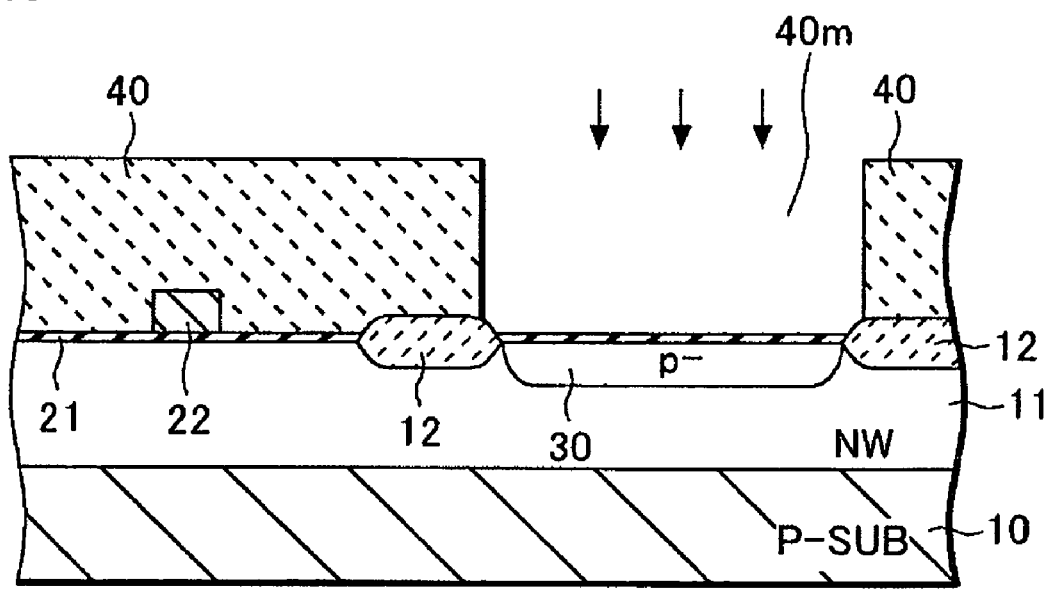
FIG. 9 is a cross-sectional view showing the manufacturing method of the semiconductor device according to the conventional art.
Figure 10:
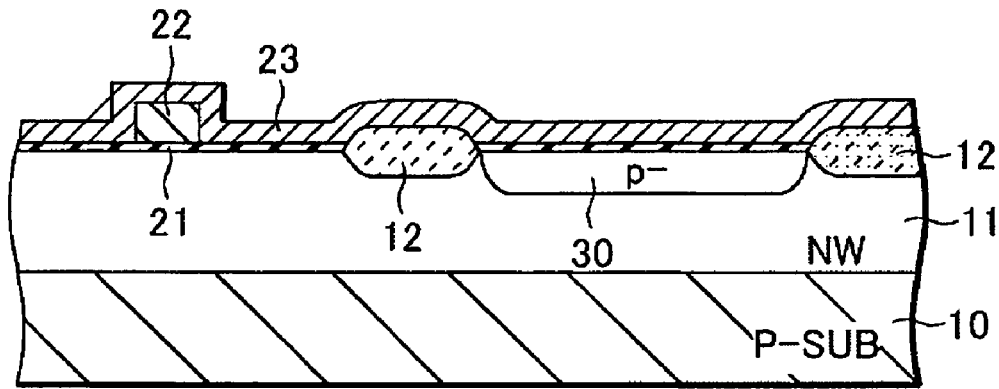
FIG. 10 is a cross-sectional view showing the manufacturing method of the semiconductor device according to the conventional art.
Figure 11:
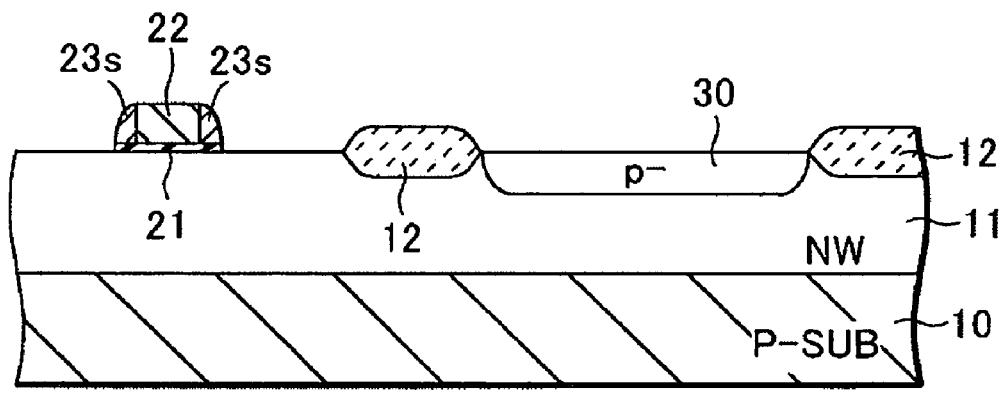
FIG. 11 is a cross-sectional view showing the manufacturing method of the semiconductor device according to the conventional art.
Figure 12:
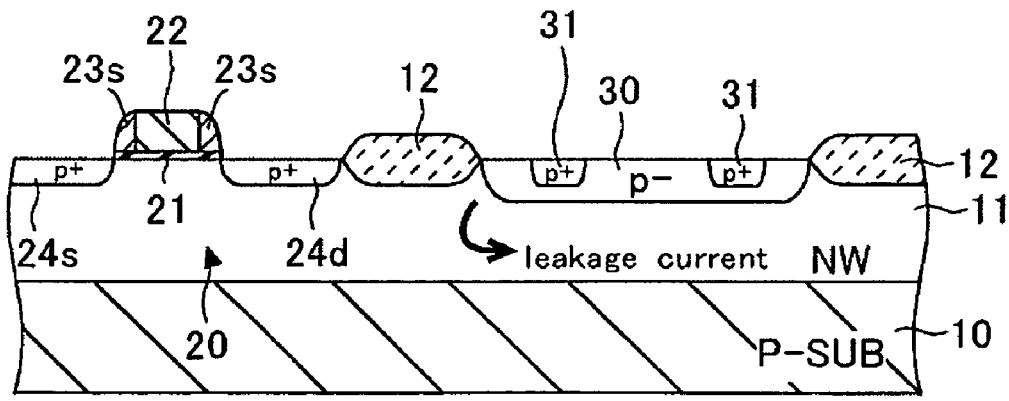
FIG. 12 is a cross-sectional view showing the manufacturing method of the semiconductor device according to the conventional art.

Next, the N-type well 11 and the P−-type diffusion layer are doped with high concentration P-type impurities using the gate electrode 22, the damage prevention films 22b and the sidewall spacers 23s as a mask, as shown in FIG. 7. A source layer 24s and a drain layer 24d of the MOS transistor 20 are formed together with the P+-type layers 31 which serve as the contact regions to the diffused resistor layer 30. Here, the high concentration P-type impurities are boron difluoride ions ($BF_2^+$), for example. In the doping, the acceleration energy is about 40 KeV and the dose of the P-type impurities is about $3\times10^{15}/cm^2$ preferably.

Forming interconnections to the source layer 24s, the drain layer 24d and the P+-type layers 31 completes the MOS transistor 20 and the diffused resistor layer 30 formed on the same semiconductor substrate 10.

According to the manufacturing method described above, the diffused resistor layer 30, especially a region in the diffused resistor layer 30 close to a border with the device isolation layer 12 is not damaged by the over-etching. Thus, the leakage current caused in the prior art is prevented with the manufacturing method according to the embodiment, even when the semiconductor device operates at a high temperature (for example, when the bipolar transistor (not shown) drives a large current and generates a large amount of Joule heat). Consequently, the deterioration due to the leakage current is prevented as well.

Although the device isolation layer 12 is formed to be about 500 nm and the gate insulation film 21 is formed to be about 120 nm in thickness in the embodiment, this invention is not limited to the above. They may be formed to be other thicknesses.

Also, in the low concentration doping, the impurities are boron ions ($B^+$), the acceleration energy is about 30 KeV and the dose of the impurities is about $6\times10^{12}/cm^2$, while in the high concentration doping, the impurities are boron difluoride ions ($BF_2^+$), the acceleration energy is about 40 KeV and the dose of the impurities is about $3\times10^{15}/cm^2$ in the embodiment. However, this invention is not limited to the above. That is, the low concentration impurities and the high concentration impurities may be other impurities, the acceleration energy may be other amounts of energy, and the doses may be other amounts of doses.

Also, the MOS transistor 20 is a so-called conventional transistor having the source layer 24s and the drain layer 24d formed of the P+-type diffusion layers only. However, this invention is not limited to the above. That is, this invention may be applied to a MOS transistor having LDD (Lightly Doped Drain) structure with a source layer and a drain layer each made of a combination of a P−-type diffusion layer and a P+-type diffusion layer, as long as a sidewall spacer is formed on each sidewall of a gate electrode of the MOS transistor.

Furthermore, the P-channel MOS transistor 20 and the P−-type diffused resistor layer 30 are formed in the N-type well 11 formed on the P-type semiconductor substrate 10 by doping the N-type well 11 with the p-type impurities in the embodiment. However, this invention is not limited to the above. That is, an N-channel MOS transistor and N−-type diffused resistor layer may be formed in a P-type semiconductor substrate by doping the P-type semiconductor substrate with N-type impurities. Furthermore, an N-channel MOS transistor and N−-type diffused resistor layer may be formed in a P-type well formed on an N-type semiconductor substrate by doping the P-type well with N-type impurities. Or, a P-channel MOS transistor and a P−-type diffused resistor layer may be formed in an N-type semiconductor substrate or in a N-type well by doping the N-type semiconductor substrate or the N-type well with P-type impurities.

According to this invention, the damage prevention films are formed above a portion of the diffused resistor layer, especially above the region in the diffused resistor layer close to the border with the device isolation layer in the process step to form the gate electrode of the MOS transistor. By doing so, the over-etching is avoided in a region where the leakage current is caused. Therefore, the leakage current due to the damage to the region is suppressed. As a result, the deterioration in the operational characteristics of the diffused resistor layer is suppressed even when a bipolar transistor capable of driving a large current is integrated onto the same semiconductor substrate on which the diffused resistor layer and the MOS transistor are formed.

What is claimed is:

1. A method of manufacturing a semiconductor device comprising a MOS transistor and a diffused resistor layer that are formed on a semiconductor substrate, the method comprising:

forming an isolation layer on the semiconductor substrate;

forming a gate insulation film on the semiconductor substrate;

forming the diffused resistor layer by doping with a low concentration of impurities a portion of the semiconductor substrate defined by the device isolation layer;

forming a film of a gate electrode material on the device isolation layer and the gate insulation film;

forming a mask on the film of the gate electrode material to cover portions of the film of the gate electrode material that correspond to a gate electrode of the MOS transistor and an area of the diffused resistor layer;

etching the film of the gate electrode material using the mask so that the gate electrode and a damage prevention film are formed;

forming a spacer insulation film over a surface of the semiconductor substrate on which the gate electrode and the damage prevention film are formed; and etching the spacer insulation film so that a sidewall spacer is formed on a sidewall of the gate electrode and another sidewall spacer is formed on a sidewall of the damage prevention film.

2. The method of claim 1, further comprising doping portions of the semiconductor substrate with a high concentration of impurities using the gate electrode, the damage prevention film and the sidewall spacers as a mask so that a source layer and a drain layer of the MOS transistor are formed.

3. The method of claim 1, wherein the forming of the spacer insulation film comprises a chemical vapor deposition.

4. The method of claim 1, further comprising forming a bipolar transistor on the semiconductor substrate.

5. A method of manufacturing a semiconductor device comprising a MOS transistor and a diffused resistor layer of a first conductivity type that are formed on a semiconductor substrate of the first conductivity type, the method comprising:

forming a well of a second conductivity type on the semiconductor substrate;

forming a device isolation layer on the well;

forming a gate insulation film on the well;

forming a photoresist layer having an opening above a first region of the well defined by the device isolation layer;

doping the first region of the well with a low concentration of impurities of the first conductivity type through the opening of the photoresist layer so that the diffused resistor layer of the first conductivity type is formed;

forming a film of a gate electrode material on the device isolation layer and the gate insulation film;

forming a mask on the film of the gate electrode material to cover portions of the film of the gate electrode material that correspond to a gate electrode of the MOS transistor and an area of the diffused resistor layer;

etching the film of gate the electrode material using the mask so that the gate electrode and a damage prevention film are formed;

forming a spacer insulation film over a surface of the semiconductor substrate on which the gate electrode and the damage prevention film are formed;

etching the spacer insulation film so that a sidewall spacer is formed on a sidewall of the gate electrode and another sidewall spacer is formed on a sidewall of the damage prevention film; and doping second regions of the well and portions of the diffused resistor layer with a high concentration of impurities of the first conductivity type using the gate electrode, the damage prevention film and the sidewall spacers as a mask so that a source layer and a drain layer of the MOS transistor and contact regions to the diffused resistor layer are formed.

6. The method of claim 5, wherein the forming of the spacer insulation film comprises a chemical vapor deposition.

7. The method of claim 5, further comprising forming a bipolar transistor on the semiconductor substrate.

\* \* \* \* \*